(12) United States Patent
Venugopal et al.

(10) Patent No.: US 12,500,082 B2
(45) Date of Patent: Dec. 16, 2025

(54) SEMICONDCTOR DEVICE PACKAGE THERMAL CONDUIT

(71) Applicant: TEXAS INSTRUMENTS INCORPORATED, Dallas, TX (US)

(72) Inventors: Archana Venugopal, Dallas, TX (US); Benjamin Stassen Cook, Rockwall, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/315,524

(22) Filed: May 10, 2021

(65) Prior Publication Data
US 2021/0272804 A1    Sep. 2, 2021

Related U.S. Application Data

(63) Continuation of application No. 15/361,403, filed on Nov. 26, 2016, now Pat. No. 11,004,680.

(51) Int. Cl.
*H01L 23/34* (2006.01)
*H01L 21/02* (2006.01)
(Continued)

(52) U.S. Cl.
CPC .. *H01L 21/02354* (2013.01); *H01L 21/02288* (2013.01); *H01L 21/56* (2013.01);
(Continued)

(58) Field of Classification Search
CPC .............. H01L 21/02354; H01L 21/56; H01L 23/3737; H01L 23/5226; H01L 23/5283;
(Continued)

(56) References Cited

U.S. PATENT DOCUMENTS

| 5,224,030 A | 6/1993 | Banks et al. |
| 5,481,136 A | 1/1996 | Kohmoto et al. |

(Continued)

FOREIGN PATENT DOCUMENTS

| CN | 105419345 | 3/2016 |
| EP | 2388810 | 11/2011 |

(Continued)

OTHER PUBLICATIONS

Awano et al., Carbon Nanotubes for VLSI: Interconnect and Transistor Applications'—2010, Proceedings of the IEEE, vol. 98, No. 12, pp. 2015-2031.

(Continued)

*Primary Examiner* — Jami Valentine Miller
(74) *Attorney, Agent, or Firm* — Frank D. Cimino (57) ABSTRACT

A packaged electronic device includes an integrated circuit and an electrically non-conductive encapsulation material in contact with the integrated circuit. A thermal conduit extends from an exterior of the package, through the encapsulation material, to the integrated circuit. The thermal conduit has a thermal conductivity higher than the encapsulation material contacting the thermal conduit. The thermal conduit includes a cohered nanoparticle film. The cohered nanoparticle film is formed by a method which includes an additive process.

25 Claims, 10 Drawing Sheets

(51) Int. Cl.
- H01L 21/56 (2006.01)
- H01L 23/367 (2006.01)
- H01L 23/373 (2006.01)
- H01L 23/433 (2006.01)
- H01L 23/522 (2006.01)
- H01L 23/528 (2006.01)
- H01L 23/00 (2006.01)
- H01L 23/31 (2006.01)

(52) U.S. Cl.
CPC ........ H01L 23/3677 (2013.01); H01L 23/373 (2013.01); H01L 23/3737 (2013.01); H01L 23/4334 (2013.01); H01L 23/5226 (2013.01); H01L 23/5283 (2013.01); H01L 23/3121 (2013.01); H01L 23/34 (2013.01); H01L 24/13 (2013.01); H01L 24/16 (2013.01); H01L 24/48 (2013.01); H01L 24/73 (2013.01); H01L 2224/0401 (2013.01); H01L 2224/04042 (2013.01); H01L 2224/131 (2013.01); H01L 2224/16227 (2013.01); H01L 2224/48091 (2013.01); H01L 2224/48247 (2013.01); H01L 2224/48465 (2013.01); H01L 2224/73265 (2013.01); H01L 2924/10253 (2013.01); H01L 2924/1033 (2013.01); H01L 2924/14 (2013.01); H01L 2924/15313 (2013.01)

(58) Field of Classification Search
CPC ......... H01L 23/3121; H01L 2224/0401; H01L 2224/04042
USPC ....................................................... 257/713
See application file for complete search history.

(56) References Cited

U.S. PATENT DOCUMENTS

| | | |
|---|---|---|
| 5,683,939 A | 11/1997 | Schrantz et al. |
| 6,046,503 A | 4/2000 | Weigand et al. |
| 6,100,199 A | 8/2000 | Joshi et al. |
| 6,242,807 B1 | 6/2001 | Kazami |
| 6,265,771 B1 | 7/2001 | Ference et al. |
| 6,288,426 B1 | 9/2001 | Gauthier, Jr. et al. |
| 6,646,340 B2 | 11/2003 | Deeter et al. |
| 6,771,502 B2 | 8/2004 | Getz, Jr. et al. |
| 6,773,952 B2 | 8/2004 | Armbrust et al. |
| 6,800,886 B2 | 10/2004 | Awano |
| 7,071,603 B2 | 7/2006 | Ha et al. |
| 7,161,239 B2 | 1/2007 | Zhao et al. |
| 7,189,778 B2 | 3/2007 | Tobita |
| 7,260,939 B2 | 8/2007 | Weaver, Jr. |
| 7,264,869 B2 | 9/2007 | Tobita |
| 7,286,359 B2 | 10/2007 | Khbeis et al. |
| 7,312,531 B2 | 12/2007 | Chang et al. |
| 7,345,364 B2 | 3/2008 | Kerr et al. |
| 7,473,633 B2 | 1/2009 | Furukawa et al. |
| 7,560,310 B2 | 7/2009 | Hsu |
| 7,572,680 B2 | 8/2009 | Hess |
| 7,582,962 B1 | 9/2009 | Pavio |
| 7,586,191 B2 | 9/2009 | Hall et al. |
| 7,633,152 B2 | 12/2009 | Lee et al. |
| 7,642,641 B2 | 1/2010 | Mahler et al. |
| 7,763,973 B1 | 7/2010 | Bratkovski |
| 7,768,121 B2 | 8/2010 | Colgan et al. |
| 7,772,692 B2 | 8/2010 | Takamatsu et al. |
| 7,773,973 B2 | 8/2010 | Wang et al. |
| 7,825,498 B2 | 11/2010 | Haga et al. |
| 7,859,087 B2 | 12/2010 | Murata et al. |
| 7,989,349 B2 | 8/2011 | Sandhu et al. |
| 8,022,532 B2 | 9/2011 | Kasuya et al. |
| 8,106,497 B2 | 1/2012 | Brunnbauer |
| 8,130,500 B2 | 3/2012 | Oda |
| 8,134,231 B2 | 3/2012 | Sano et al. |
| 8,148,820 B2 | 4/2012 | Sata |
| 8,248,803 B2 | 8/2012 | Lin et al. |
| 8,257,795 B2 | 9/2012 | Lu |
| 8,277,613 B2 | 10/2012 | Smith |
| 8,410,474 B2 | 4/2013 | Okai et al. |
| 8,440,999 B2 | 5/2013 | Dimitrakopoulos et al. |
| 8,462,511 B2 | 6/2013 | Lee |
| 8,466,054 B2 | 6/2013 | Stuber et al. |
| 8,470,701 B2 | 6/2013 | Rogers et al. |
| 8,486,824 B2 | 7/2013 | Tee et al. |
| 8,524,539 B2 | 9/2013 | Lee et al. |
| 8,535,758 B2 | 9/2013 | Bulovic |
| 8,552,554 B2 | 10/2013 | Tain et al. |
| 8,558,372 B2 | 10/2013 | Negoro |
| 8,587,064 B2 | 11/2013 | Warabino |
| 8,637,388 B2 | 1/2014 | Abou-Khalik et al. |
| 8,664,759 B2 | 3/2014 | Ryan |
| 8,836,110 B2 | 9/2014 | Chopin et al. |
| 8,865,577 B2 | 10/2014 | Wei |
| 8,866,276 B2 | 10/2014 | Su et al. |
| 8,866,294 B2 | 10/2014 | Pagaila et al. |
| 8,901,613 B2 | 12/2014 | Sekar et al. |
| 8,937,376 B2 | 1/2015 | Tsai |
| 8,940,628 B2 | 1/2015 | Yamazaki et al. |
| 9,013,035 B2 | 4/2015 | Zhao et al. |
| 9,093,428 B2 | 7/2015 | Liang |
| 9,099,375 B2 | 8/2015 | Kub et al. |
| 9,165,721 B2 | 10/2015 | Lee et al. |
| 9,171,779 B2 | 10/2015 | Lin et al. |
| 9,245,813 B2 | 1/2016 | Bartley et al. |
| 9,308,731 B2 | 4/2016 | Williams |
| 9,331,283 B2 | 5/2016 | Lim et al. |
| 9,349,838 B2 | 5/2016 | Cheng et al. |
| 9,349,975 B2 | 5/2016 | Coe-Sullivan et al. |
| 9,362,198 B2 | 6/2016 | Viswanathan |
| 9,397,023 B2 | 7/2016 | Venugopal et al. |
| 9,401,315 B1 | 7/2016 | Bodenweber |
| 9,434,003 B2* | 9/2016 | Zobl ................... H01M 8/0215 |
| 10,256,188 B2* | 4/2019 | Venugopal ........ H01L 21/32051 |
| 2001/0035578 A1 | 11/2001 | Liang et al. |
| 2003/0064017 A1 | 4/2003 | Tobita et al. |
| 2003/0122215 A1 | 7/2003 | Wilson |
| 2003/0209802 A1 | 11/2003 | Awano |
| 2004/0102597 A1 | 5/2004 | Tobita |
| 2004/0245085 A1* | 12/2004 | Srinivasan ............. B82Y 30/00 |
| | | 422/186.01 |
| 2005/0079120 A1 | 4/2005 | Fujita et al. |
| 2005/0133863 A1 | 6/2005 | Werner et al. |
| 2006/0121710 A1 | 6/2006 | Liang et al. |
| 2006/0289988 A1 | 12/2006 | Rayn |
| 2007/0001292 A1 | 1/2007 | Ohta et al. |
| 2007/0035011 A1 | 2/2007 | Hall |
| 2007/0064398 A1 | 3/2007 | Lee |
| 2007/0126116 A1 | 6/2007 | Dangelo et al. |
| 2007/0148972 A1 | 6/2007 | Hara et al. |
| 2008/0047484 A1 | 2/2008 | Sung |
| 2008/0131352 A1 | 6/2008 | Kondo |
| 2008/0266787 A1 | 10/2008 | Gosset et al. |
| 2009/0162954 A1 | 6/2009 | Griffin et al. |
| 2009/0218682 A1 | 9/2009 | Lundberg |
| 2009/0273068 A1 | 11/2009 | Kaskoun et al. |
| 2010/0140790 A1 | 6/2010 | Setiadi et al. |
| 2010/0148357 A1 | 6/2010 | Yang et al. |
| 2010/0207277 A1 | 8/2010 | Bauer et al. |
| 2011/0039357 A1 | 2/2011 | Lin et al. |
| 2011/0140232 A1 | 6/2011 | Gaul et al. |
| 2011/0260303 A1 | 10/2011 | Pagaila et al. |
| 2011/0272824 A1 | 11/2011 | Pagaila |
| 2012/0025269 A1 | 2/2012 | Parkhurst et al. |
| 2012/0042922 A1 | 2/2012 | Kondo et al. |
| 2012/0086132 A1 | 4/2012 | Kim |
| 2012/0141678 A1 | 6/2012 | Sumerel |
| 2013/0127037 A1 | 5/2013 | Mori |
| 2013/0160701 A1 | 6/2013 | Arnold et al. |
| 2014/0008756 A1 | 1/2014 | Pei et al. |
| 2014/0014975 A1 | 1/2014 | Bae et al. |
| 2014/0015158 A1 | 1/2014 | Cola |
| 2014/0057393 A1 | 2/2014 | Bonart |
| 2014/0106508 A1 | 4/2014 | Sutardja et al. |
| 2014/0131860 A1 | 5/2014 | Kanda et al. |

(56) References Cited

U.S. PATENT DOCUMENTS

| | | | |
|---|---|---|---|
| 2014/0131898 A1 | 5/2014 | Shearer et al. | |
| 2014/0142382 A1 | 5/2014 | Bassan et al. | |
| 2014/0321026 A1 | 10/2014 | Hermann et al. | |
| 2014/0321093 A1 | 10/2014 | Pande | |
| 2015/0008525 A1 | 1/2015 | Fukuzaki et al. | |
| 2015/0084103 A1 | 3/2015 | Okazaki et al. | |
| 2015/0129190 A1 | 5/2015 | Lin | |
| 2015/0136357 A1 | 5/2015 | Johnson | |
| 2015/0137307 A1 | 5/2015 | Stuber | |
| 2015/0152239 A1 | 6/2015 | Guilera Grandes et al. | |
| 2015/0159969 A1 | 6/2015 | Lu et al. | |
| 2015/0162346 A1 | 6/2015 | Choi et al. | |
| 2015/0166921 A1* | 6/2015 | Erdemir | C10M 105/04 428/367 |
| 2015/0187678 A1 | 7/2015 | Park et al. | |
| 2015/0206822 A1* | 7/2015 | Oda | H01L 23/433 428/192 |
| 2015/0218694 A1 | 8/2015 | Xu et al. | |
| 2015/0228628 A1 | 8/2015 | Pagaila | |
| 2015/0237762 A1 | 8/2015 | Holt et al. | |
| 2015/0249126 A1 | 9/2015 | Kataoka et al. | |
| 2015/0255451 A1 | 9/2015 | Yasusaka | |
| 2015/0270356 A1 | 9/2015 | Palacios et al. | |
| 2015/0315442 A1 | 11/2015 | Hofius | |
| 2015/0325524 A1 | 11/2015 | Wada et al. | |
| 2015/0325531 A1 | 11/2015 | Dyer et al. | |
| 2015/0348865 A1 | 12/2015 | Vincent et al. | |
| 2016/0027717 A1 | 1/2016 | Jang et al. | |
| 2016/0093551 A1 | 3/2016 | Venugopal | |
| 2016/0111610 A1* | 4/2016 | Ota | H01L 33/56 252/301.36 |
| 2016/0152794 A1 | 6/2016 | Diaham et al. | |
| 2016/0197027 A1 | 7/2016 | Nasser-faili | |
| 2016/0215172 A1 | 7/2016 | Morita et al. | |
| 2016/0291256 A1 | 10/2016 | Rollinger | |
| 2016/0329343 A1 | 11/2016 | Pachamuthu | |
| 2016/0379960 A1 | 12/2016 | Huang et al. | |
| 2016/0380090 A1 | 12/2016 | Roberts et al. | |
| 2017/0011991 A1 | 1/2017 | Khazaka et al. | |
| 2017/0012017 A1 | 1/2017 | Khazaka et al. | |
| 2017/0040506 A1* | 2/2017 | Abe | H01L 33/501 |
| 2017/0047307 A1* | 2/2017 | Uzoh | H01L 24/83 |
| 2017/0338214 A1 | 11/2017 | Uzoh et al. | |
| 2018/0151470 A1* | 5/2018 | Cook | H01L 23/5226 |
| 2018/0153030 A1* | 5/2018 | Viswanathan | H05K 1/185 |
| 2019/0098743 A1* | 3/2019 | Molla | H01L 23/3735 |
| 2021/0272804 A1* | 9/2021 | Venugopal | H01L 23/373 |

FOREIGN PATENT DOCUMENTS

| | | |
|---|---|---|
| JP | 2002088257 | 3/2002 |
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Sato et al., "Growth of diameter-controlled carbon nanotubes using monodisperse nicket nanoparticles obtained with a differential mobility analyzer"—2003, Chemical Phys. Lett. 382 (2003) 361-366.

Sabine Szunerits, et al.; "Diamond Nanowires: A Novel Platform for Electrochemistry and Matrix-Free Mass Spectrometry"; Sensors; ISSN 1424-8220; www.mdpi.com/journal/sensors; Apr. 19, 2015; Published: May 27, 2015; pp. 12573-12593.

International Search Report for PCT/US2017/063136 mailed Apr. 5, 2018.

International Search Report for PCT/US2017/063131 mailed Apr. 19, 2018.

Non-Final Office Action received for U.S. Appl. No. 17/114,219 mailed on May 12, 2022, 8 pages.

Teng et al., Nanoimprint assisted inkjet printing to fabricate sub-micron channel organic field effect transistors, https://www.sciencedirect.com/science/article/pii/S0167931713001287#f0005; 6 pages, 2013.

\* cited by examiner

SEMICONDCTOR DEVICE PACKAGE THERMAL CONDUIT

CROSS-REFERENCE TO RELATED APPLICATIONS

This application is a continuation of U.S. patent application Ser. No. 15/361,403, filed Nov. 26, 2016, which is incorporated by reference herein in its entirety.

FIELD OF THE INVENTION

This disclosure relates to the field of integrated circuits. More particularly, this disclosure relates to thermal management in integrated circuits.

BACKGROUND OF THE INVENTION

Integrated circuits frequently generate undesired heat in some active components. It is sometimes desired to remove the heat through a heat sink or other passive structure. It is sometimes desired to divert the heat from thermally sensitive components in the integrated circuit. Managing excess heat in integrated circuits has become increasingly problematic.

SUMMARY OF THE INVENTION

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A packaged electronic device includes an integrated circuit and an electrically non-conductive encapsulation material in contact with the integrated circuit. A thermal conduit extends from an exterior of the package, through the encapsulation material, to the integrated circuit. The thermal conduit has a thermal conductivity higher than the encapsulation material contacting the thermal conduit. The thermal conduit includes a cohered nanoparticle film. The cohered nanoparticle film is formed by a method which includes an additive process.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent applications are related and hereby incorporated by reference: U.S. patent application Ser. No. 15/361,390, U.S. patent application Ser. No. 15/361,394, U.S. patent application Ser. No. 15/361,397, U.S. patent application Ser. No. 15/361,399, U.S. patent application Ser. No. 15/361,401, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

Figure 1A:
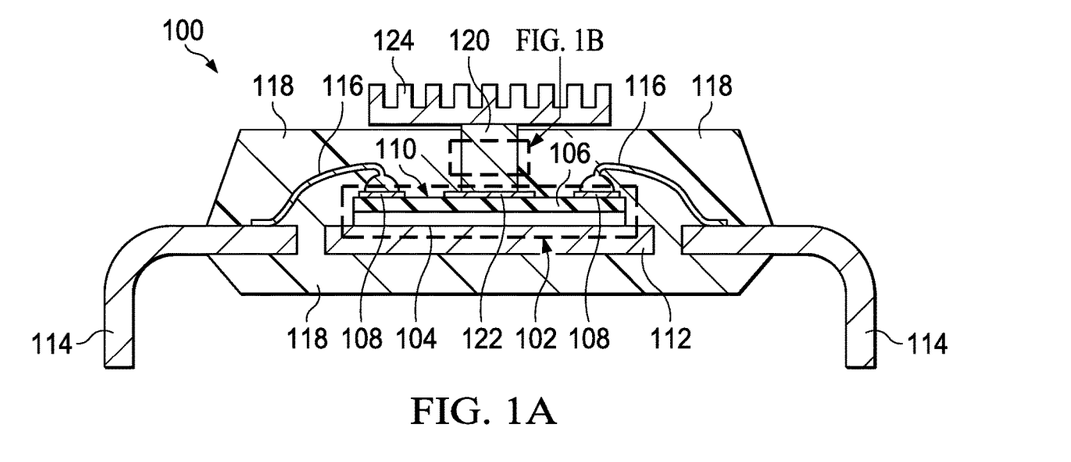
FIG. 1A and FIG. 1B are cross sections of an example packaged electronic device containing a thermal conduit according to an embodiment of the invention.
Figure 1B:
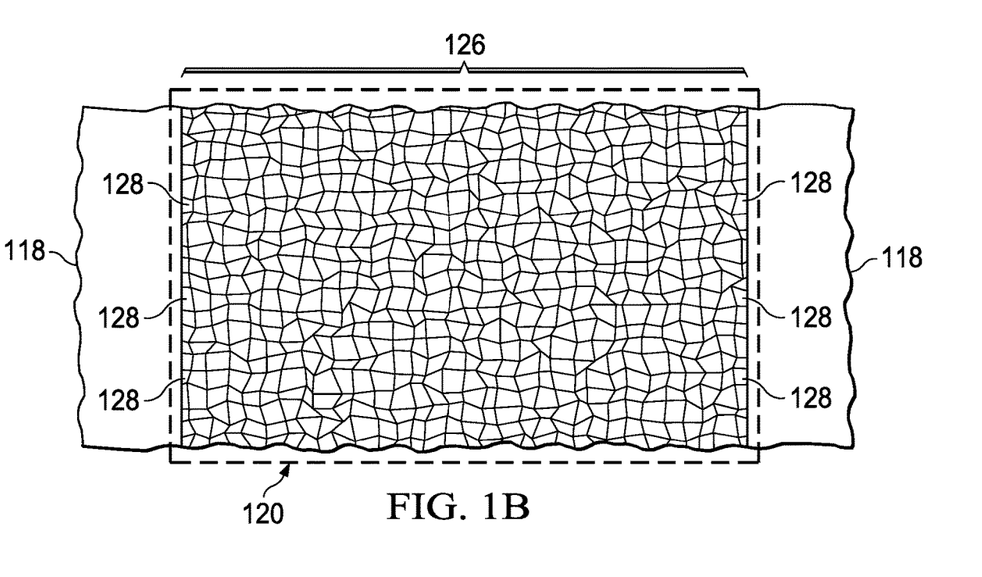

FIG. 1A and FIG. 1B are cross sections of an example packaged electronic device containing a thermal conduit according to an embodiment of the invention. Referring to FIG. 1A, the packaged electronic device 100 includes an integrated circuit 102. The integrated circuit 102 has a substrate 104 which includes a semiconductor material such as silicon or gallium nitride. The integrated circuit 102 includes active devices such as transistors disposed in the substrate 104. The integrated circuit 102 further includes an interconnect region 106 contacting the substrate 104. In the instant example, the integrated circuit 102 includes bond pad structures 108 disposed proximate to a top surface 110 of the interconnect region 106. The top surface 110 of the interconnect region 106 is located at a surface of the interconnect region 106 opposite to the substrate 104. In the instant example, the integrated circuit 102 is disposed on a lead frame 112 of the packaged electronic device 100. The lead frame 112 includes a plurality of leads 114. A plurality of the bond pad structures 108 may be electrically coupled to the leads 114 by wire bonds 116. Other structures that provide electrical connections to the leads 114, such as beam leads, are within the scope of the instant example. The packaged electronic device 100 further includes an encapsulation material 118 contacting the integrated circuit 102. The encapsulation material 118 is electrically non-conductive. The encapsulation material 118 may include, for example, an organic polymer material such as epoxy. The encapsulation material 118 may provide mechanical support for the lead frame 112.

The packaged electronic device 100 includes a thermal conduit 120 extending through the encapsulation material 118 to the integrated circuit 102. In the instant example, the thermal conduit 120 may extend to a metal pad 122 of the integrated circuit 102 located at the top surface 110 of the interconnect region 106. In alternate versions of the instant example, the thermal conduit 120 may extend into the interconnect region 106. The metal pad 122, which may be formed concurrently with the bond pad structures, may be thermally coupled to a heat-generating component of the integrated circuit 102. In the instant example, the thermal conduit 120 may extend to, and be thermally coupled to, a heat sink structure 124 located externally to the encapsulation material 118. The thermal conduit 120 has a higher thermal conductivity than the encapsulation material 118 that touches the thermal conduit 120. Thermal conductivity may be understood as a property of a material, and may be expressed in units of watts/meter ° C. Thus, the thermal conduit 120 may conduct heat from the integrated circuit 102 to the heat sink structure 124 more effectively than the encapsulation material 118, advantageously reducing an operating temperature for the components of the integrated circuit 102.

The thermal conduit 120 includes a cohered nanoparticle film 126 that includes primarily nanoparticles 128, shown in more detail in FIG. 1B. In a version of the instant example depicted in FIG. 1B, the cohered nanoparticle film 126 substantially fills the thermal conduit 120. Adjacent nanoparticles 128 cohere to each other. There may be inorganic functional molecules, for example silane-based molecules comprising silicon and oxygen, on surfaces of the nanoparticles 128. The cohered nanoparticle film 126 is substantially free of an organic binder material such as adhesive or polymer.

In one version of the instant example, as depicted in FIG. 1A and FIG. 1B, the thermal conduit 120 may be electrically non-conductive, and the nanoparticles 128 may include, for example, aluminum oxide, diamond, hexagonal boron nitride, cubic boron nitride, and/or aluminum nitride. In another version of the instant example, also as depicted in FIG. 1A and FIG. 1B, the thermal conduit 120 may be electrically conductive. In such a version, the nanoparticles 128 may include, for example, metal, graphene, graphene embedded in metal, graphite, graphitic carbon, and/or carbon nanotubes. In a further version of the instant example, the nanoparticles 128 may include a metal suitable for catalysis of graphitic material, and the thermal conduit 120 may include a layer of graphitic material on the cohered nanoparticle film 126.

Figure 2A:
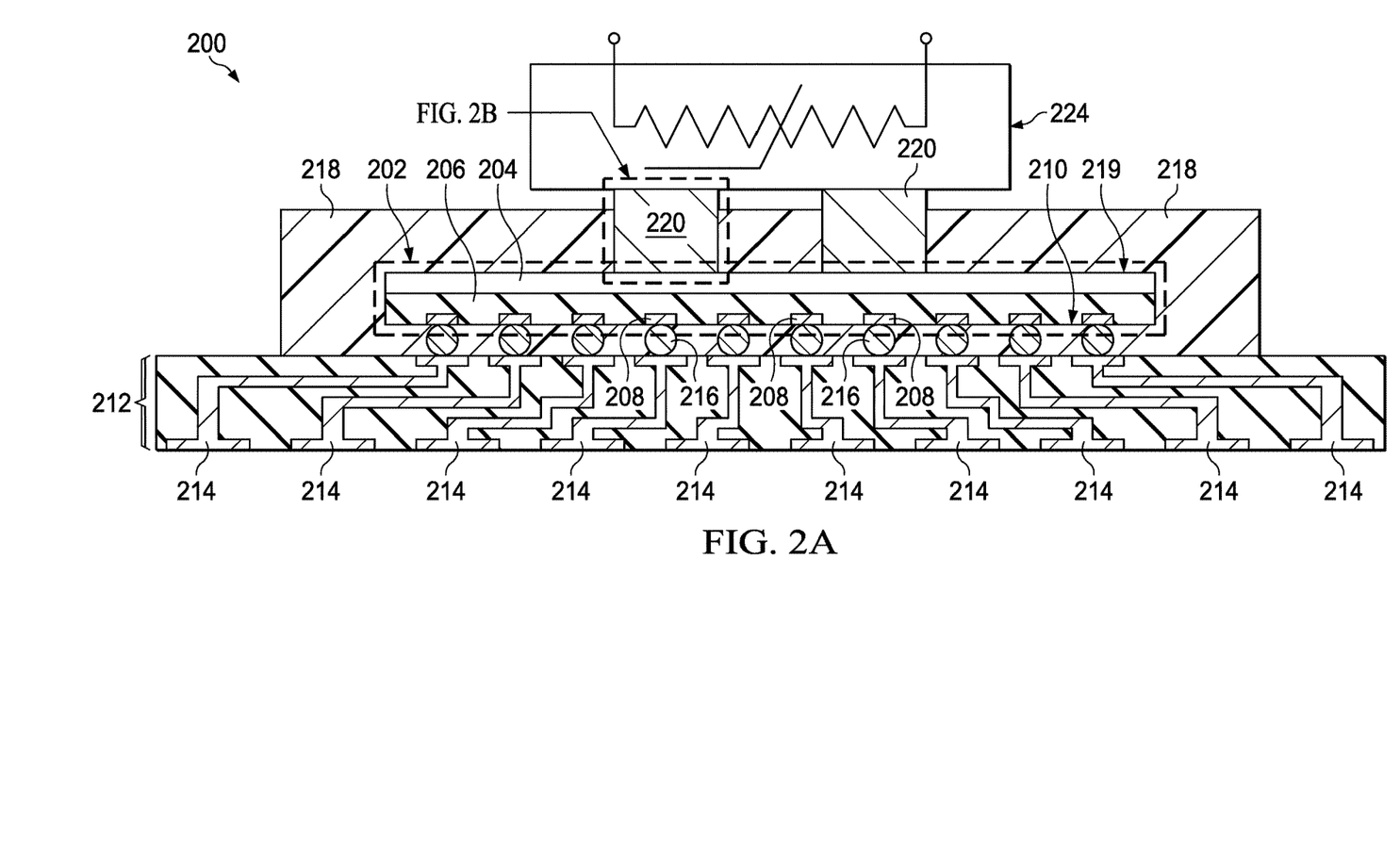
FIG. 2A and FIG. 2B are cross sections of another example packaged electronic device containing a thermal conduit according to an embodiment of the invention.
Figure 2B:
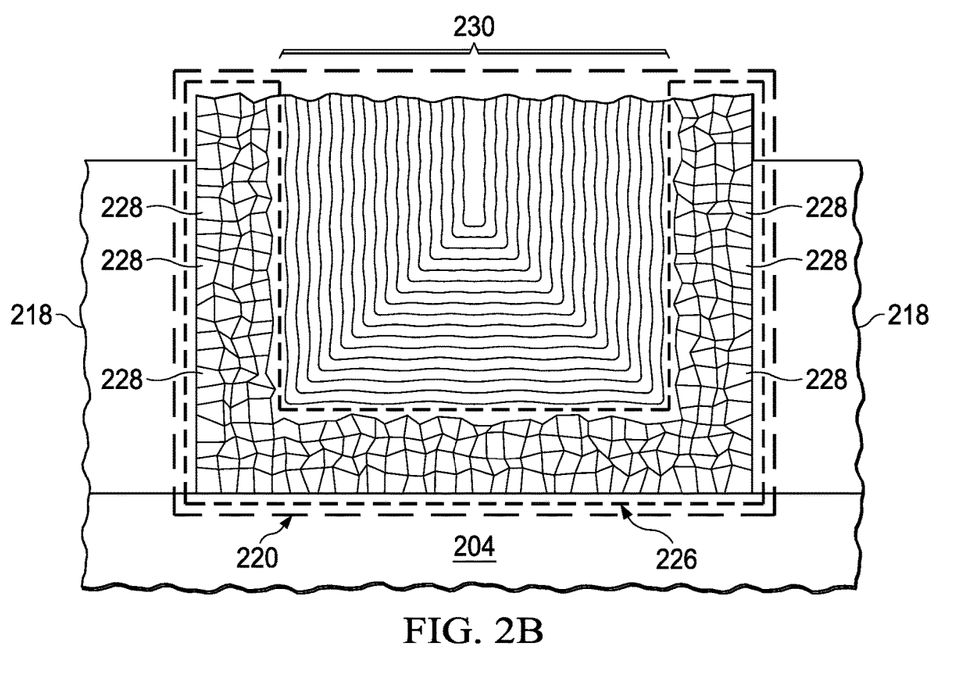

FIG. 2A and FIG. 2B are cross sections of another example packaged electronic device containing a thermal conduit according to an embodiment of the invention. Referring to FIG. 2A, the packaged electronic device 200 includes an integrated circuit 202. The integrated circuit 202 has a substrate 204 which includes a semiconductor material. The integrated circuit 202 further includes an interconnect region 206 contacting the substrate 204. In the instant example, the integrated circuit 202 includes bump pad structures 208 disposed proximate to a top surface 210 of the interconnect region 206. The top surface 210 of the interconnect region 206 is located at a surface of the interconnect region 206 opposite to the substrate 204. In the instant example, the integrated circuit 202 is disposed on a chip carrier 212 of the packaged electronic device 200. The chip carrier 212 includes a plurality of leads 214. A plurality of the bump pad structures 208 may be electrically coupled to the leads 214 by solder bumps 216. Other structures that provide electrical connections to the leads 214, such as an anisotropically conductive adhesive, are within the scope of the instant example. The packaged electronic device 200 further includes an encapsulation material 218 contacting the integrated circuit 202. In the instant example, the encapsulation material 218 contacts a back surface 219 of the substrate 204. The back surface 219 of the substrate 204 is located at a surface of the substrate 204 opposite to the interconnect region 206. The encapsulation material 218 is electrically non-conductive. The encapsulation material 218 may include, for example, an organic polymer material.

The packaged electronic device 200 includes a plurality of thermal conduits 220 extending through the encapsulation material 218 to the integrated circuit 202. In the instant example, the thermal conduits 220 may extend to the back surface 219 of the substrate 204 of the integrated circuit 202. In some versions of the instant example, the thermal conduits 220 may optionally extend into the substrate 204. In the instant example, the thermal conduits 220 may extend to, and be thermally coupled to, a temperature measurement structure 224 located externally to the encapsulation material 218. The temperature measurement structure 224 may be a thermistor, as depicted schematically in FIG. 2A, or may be a thermocouple junction, or the like. The thermal conduits 220 have a higher thermal conductivity than the encapsulation material 218 that touches the thermal conduits 220. Thus, the thermal conduits 220 may conduct heat from the integrated circuit 202 to the temperature measurement structure 224 more effectively than the encapsulation material 218, advantageously providing a more accurate temperature measurement of the integrated circuit 202.

Each of the thermal conduits 220 has a structure shown in FIG. 2B. Referring to FIG. 2B, each thermal conduit 220 includes a cohered nanoparticle film 226 that includes nanoparticles 228. In a version of the instant example depicted in FIG. 2B, the cohered nanoparticle film 226 extends along a bottom and sides of the thermal conduits 220. Adjacent nanoparticles 228 cohere to each other. There may be inorganic functional molecules on surfaces of the nanoparticles 228. The cohered nanoparticle film 226 is substantially free of an organic binder material such as adhesive or polymer. In the instant example, the nanoparticles 228 include one or more metals suitable for catalysis of graphitic material. The nanoparticles 228 may include, for example, copper, nickel, palladium, platinum, iridium, rhodium, cerium, osmium, molybdenum, and/or gold. A layer of graphitic material 230 is disposed on the cohered nanoparticle film 226. The graphitic material 230 may include graphite, graphitic carbon, graphene, and/or carbon nanotubes or the like. In an alternate version of the instant example the thermal conduits 220 may include primarily electrically non-conductive nanoparticles and/or electrically conductive nanoparticles, as described in reference to FIG. 1A and FIG. 1B.

Figure 3A:
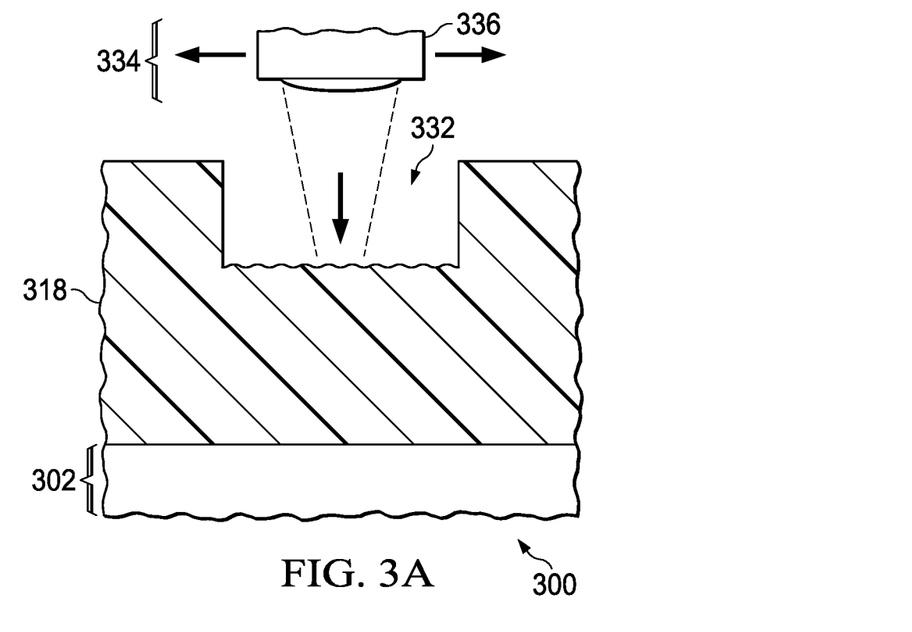
FIG. 3A through FIG. 3E are cross sections of a packaged electronic device depicted in successive stages of an example method of formation of a thermal conduit according to an embodiment of the invention.

FIG. 3A through FIG. 3E are cross sections of a packaged electronic device depicted in successive stages of an example method of formation of a thermal conduit according to an embodiment of the invention. Referring to FIG. 3A, the packaged electronic device 300 includes an integrated circuit 302 and encapsulation material 318 that contacts the integrated circuit 302. In the instant example, the encapsulation material 318 is initially disposed in a region for the subsequently-formed thermal conduit. A subtractive process 334 removes the encapsulation material 318 to form a conduit hole 332 in the region for the subsequently-formed thermal conduit. A subtractive process may be understood as a process which removes material to attain a desired structure. The subtractive process 334 may include a laser ablation operation using a laser cutter apparatus 336 as depicted in FIG. 3A. Alternately, the subtractive process 334 may include a plasma etch process, a mechanical removal process such as a drilling operation, or a wet etch process. The subtractive process 334 may be continued until the integrated circuit 302 is exposed in the conduit hole 332.

Figure 3B:
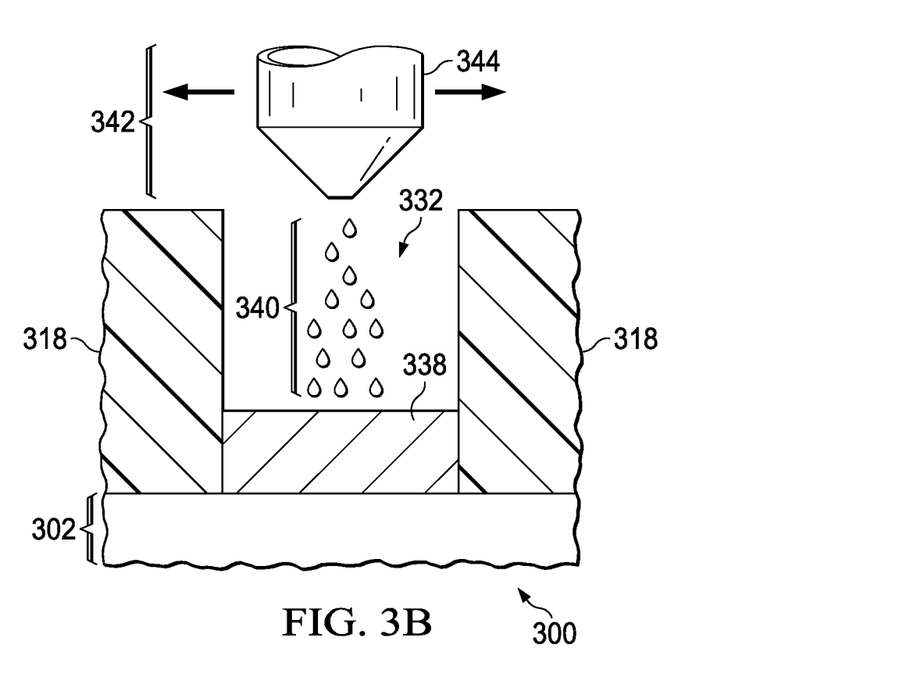

Referring to FIG. 3B, a first nanoparticle ink film 338 is formed by dispensing a first nanoparticle ink 340 by a first additive process 342 into the conduit hole 332. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. The first nanoparticle ink 340 includes the nanoparticles and a carrier fluid. The first nanoparticle ink 340 may be, for example, an ink, a slurry, or a sol gel. The nanoparticles may include materials described for the nanoparticles 128 in reference to FIG. 1A and FIG. 1B, or as described for the nanoparticles 228 in reference to FIG. 2A and FIG. 2B. The first nanoparticle ink 340 is dispensed into the conduit hole 332, and is not dispensed over the encapsulation material 318 adjacent to the conduit hole 332. The first additive process 342 may include an electrostatic deposition process using an electrostatic dispense apparatus 344 as indicated in FIG. 3B. The packaged electronic device 300 and the electrostatic dispense apparatus 344 may be configured to move laterally with respect to each other to provide a desired dispensing pattern for the first nanoparticle ink film 338. The electrostatic dispense apparatus 344 may have a plurality of dispensing ports which may be independently activated in parallel to provide a desired throughput for the first additive process 342. Other manifestations of the first additive process 342, such as a discrete droplet dispense process, a continuous extrusion process, a direct laser transfer process, or an electrochemical deposition process are within the scope of the instant example. In the instant example, the first nanoparticle ink film 338 fills the conduit hole 332 partway, but not completely.

Figure 3C:
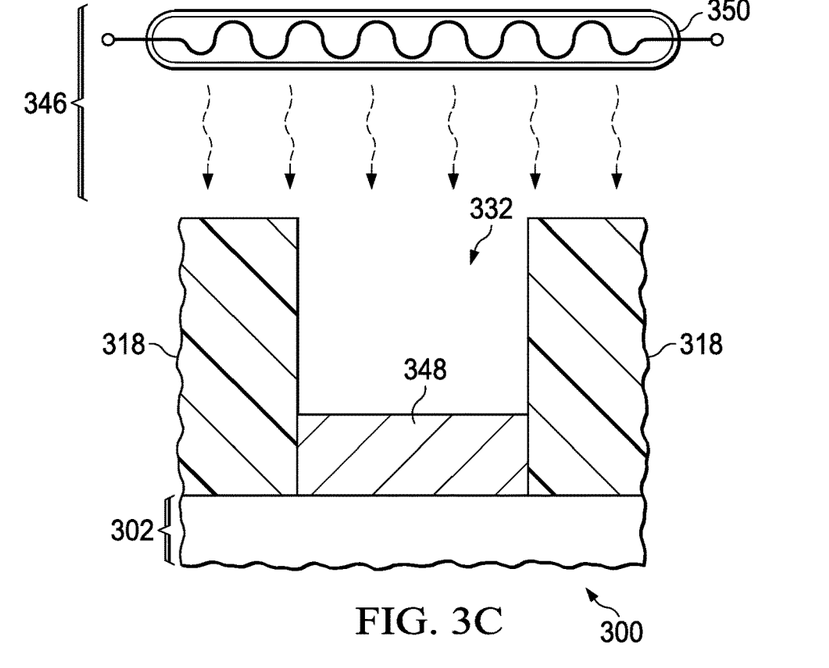

Referring to FIG. 3C, the first nanoparticle ink film 338 of FIG. 3B is heated by a first bake process 346 to remove at least a portion of a volatile material from the first nanoparticle ink film 338 to form a first nanoparticle film 348 which includes primarily nanoparticles. The first bake process 346 may be a radiant heat process, using, for example, an incandescent light source 350, as indicated schematically in FIG. 3C, or infrared light emitting diodes (IR LEDs). Alternatively, the first bake process 346 may be a hot plate process or an oven process. The first bake process 346 may be performed in a partial vacuum, or in an ambient with a continuous flow of gas, sometimes referred to as a forced convection process, to enhance removal of the volatile material.

Figure 3D:
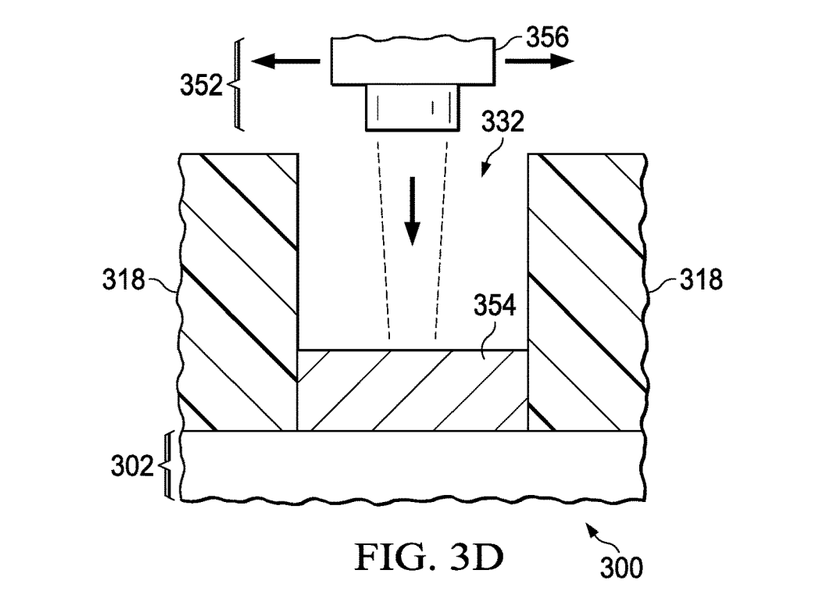

Referring to FIG. 3D, the first nanoparticle film 348 of FIG. 3C is heated by a first cohesion inducing process 352 so that adjacent nanoparticles cohere to each other, to form a first cohered nanoparticle film 354. The temperature required for the nanoparticles to cohere to each other is a function of the size of the nanoparticles. Smaller nanoparticles may be heated at lower temperatures than larger nanoparticles to attain a desired cohesion of the nanoparticles. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms between the adjacent nanoparticles. The first cohesion inducing process 352 may include a scanned laser heating process using a scanning laser apparatus 356 as depicted schematically in FIG. 3D. The scanning laser apparatus 356 may be configured to selectively apply heat to the first nanoparticle film 348.

In one variation of the instant example, the first cohesion inducing process 352 may include a flash heating process, which applies radiant energy for 1 microsecond to 10 microseconds. In another variation, the first cohesion inducing process 352 may include a spike heating process, which applies radiant energy 100 milliseconds to 5 seconds. In an alternate version of the instant example, the first bake process 346 described in reference to FIG. 3C may be combined with the first cohesion inducing process 352, wherein thermal power applied to the first nanoparticle film 348 is ramped to first remove the volatile material, followed by inducing cohesion of the nanoparticles. Other methods of inducing cohesion between the nanoparticles are within the scope of the instant example.

Figure 3E:
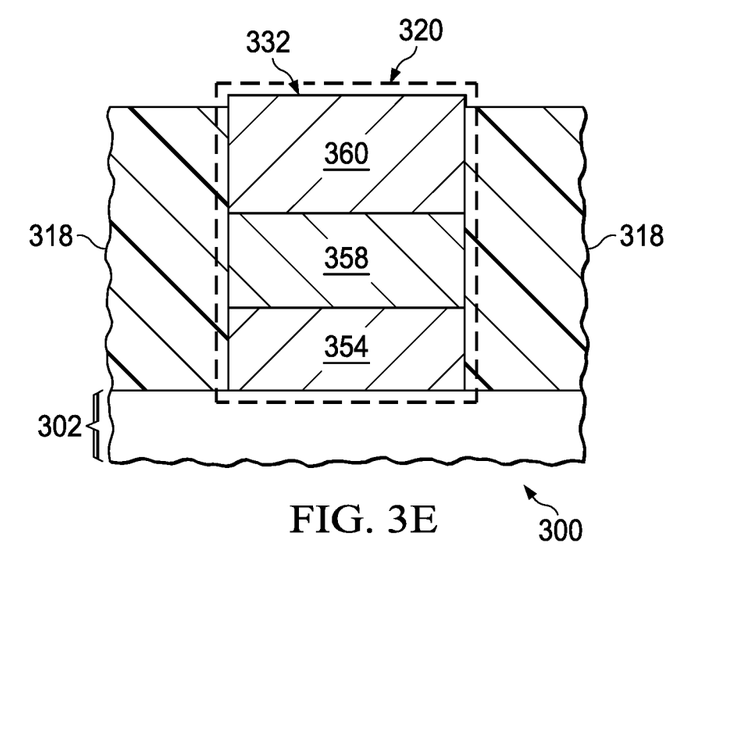

Referring to FIG. 3E, formation of the packaged electronic device 300 is continued by forming a second cohered nanoparticle film 358 in the conduit hole 332 on the first cohered nanoparticle film 354. The second cohered nanoparticle film 358 includes nanoparticles; adjacent nanoparticles in the second cohered nanoparticle film 358 cohere to each other. The second cohered nanoparticle film 358 may be formed by a process sequence that is similar to the steps disclosed in reference to FIG. 3B through FIG. 3D. The nanoparticles in the second cohered nanoparticle film 358 may have a similar composition to the nanoparticles in the first cohered nanoparticle film 354. Alternatively, the second cohered nanoparticle film 358 may be formed by a different process sequence, and the nanoparticles in the second cohered nanoparticle film 358 may have a different composition.

Formation of the packaged electronic device 300 is subsequently continued by forming a third cohered nanoparticle film 360 in the conduit hole 332 on the second cohered nanoparticle film 358. The third cohered nanoparticle film 360 also includes nanoparticles, and adjacent nanoparticles in the third cohered nanoparticle film 360 cohere to each other. A mix of electrically conductive nanoparticles and electrically non-conductive nanoparticles may be used in the first cohered nanoparticle film 354, the second cohered nanoparticle film 358, and the third cohered nanoparticle film 360 to provide a desired balance between electrical isolation and thermal conductivity. A combination of the first cohered nanoparticle film 354, the second cohered nanoparticle film 358, and the third cohered nanoparticle film 360 provide the thermal conduit 320. The thermal conduit 320 extends through the encapsulation material 318 to the integrated circuit 302 as depicted in FIG. 3E. The thermal conduit 320 has a higher thermal conductivity than the encapsulation material 318 contacting the thermal conduit 320. The thermal conduit 320 may contact a substrate or an interconnect region of the integrated circuit 302.

Figure 4A:
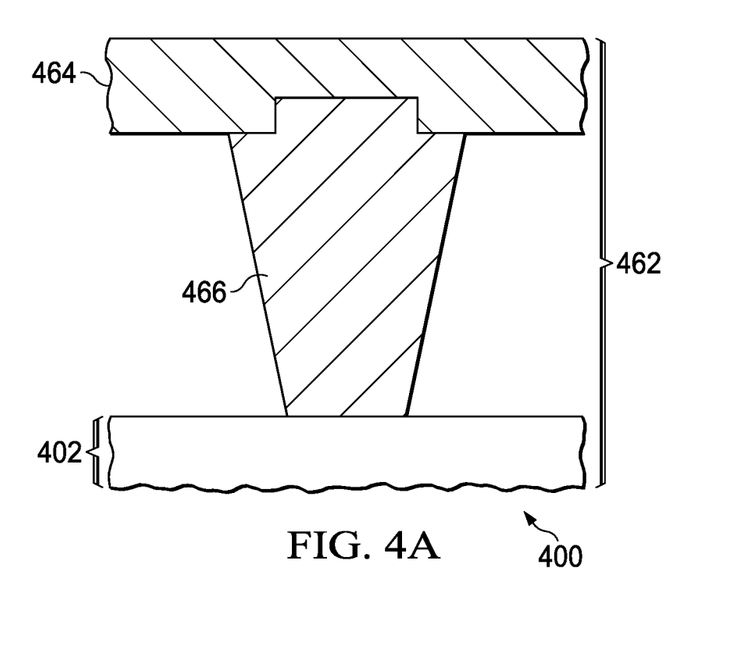
FIG. 4A through FIG. 4G are cross sections of a packaged electronic device depicted in successive stages of another example method of formation of a thermal conduit according to an embodiment of the invention.

FIG. 4A through FIG. 4G are cross sections of a packaged electronic device depicted in successive stages of another example method of formation of a thermal conduit according to an embodiment of the invention. Referring to FIG. 4A, formation of the packaged electronic device 400 begins with placing an integrated circuit 402 in an encapsulation apparatus 462 which includes a mold 464 and a conduit insert 466. The integrated circuit 402 may be assembled to a lead frame, a chip carrier, or other assembly component, not shown. The conduit insert 466 occupies a region for the subsequently-formed thermal conduit. The conduit insert 466 may be a permanent part of the encapsulation apparatus 462, or may be made of sacrificial material for one-time use. The conduit insert 466 extends from the integrated circuit 402 to the mold 464.

Figure 4B:
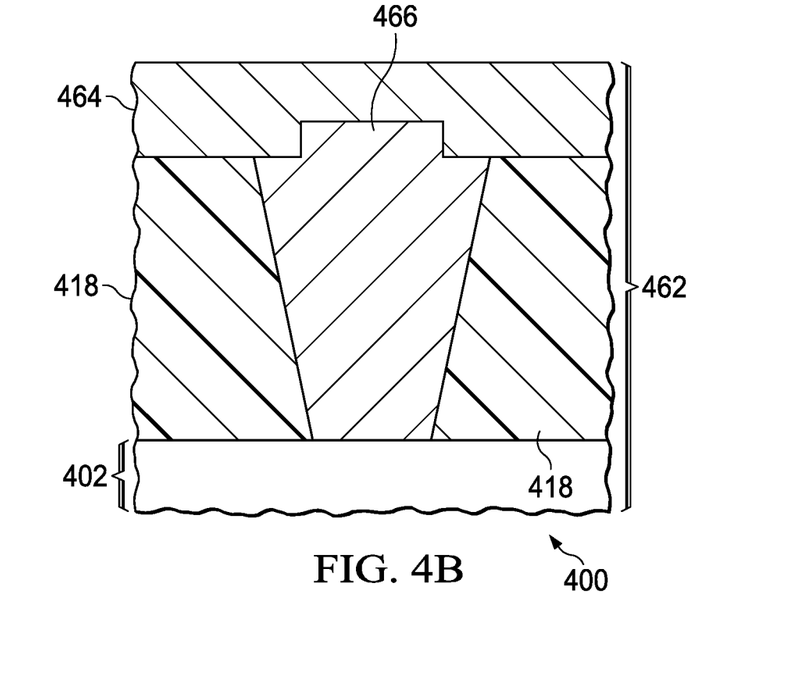

Referring to FIG. 4B, encapsulation material 418 is disposed into the encapsulation apparatus 462, substantially filling a space between the integrated circuit 402 and the mold 464. The encapsulation material 418 is excluded from the region for the subsequently-formed thermal conduit by the conduit insert 466. The encapsulation material 418 contacts the integrated circuit 402. The encapsulation material 418 may include, for example, an organic polymer such as epoxy. The encapsulation material 418 may include inorganic filler particles to improve stability at temperatures encountered in subsequent steps to form the thermal conduit. The mold 464 and the conduit insert 466 may be left in place until the encapsulation material 418 attains a desired state, for example, until the encapsulation material 418 cures, sets, or hardens.

Figure 4C:
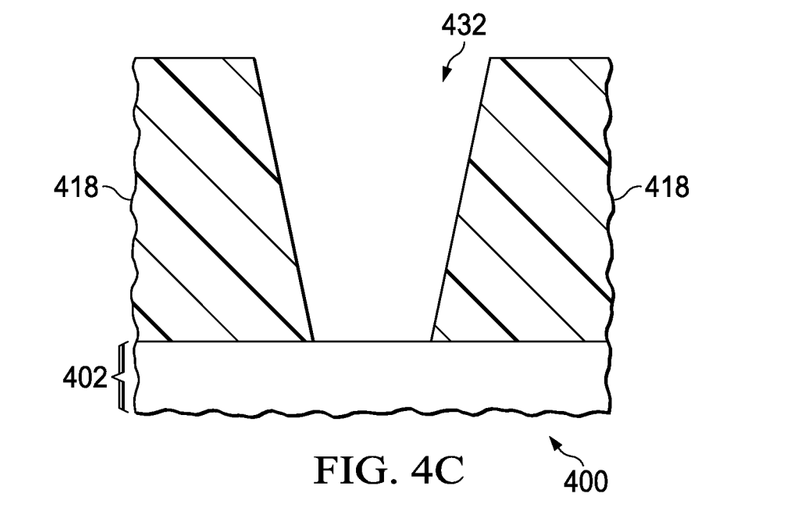

Referring to FIG. 4C, the mold 464 and conduit insert 466, both shown in FIG. 4B, are removed, leaving the encapsulation material 418 in contact with the integrated circuit 402 to form a part of the packaged electronic device 400. The conduit insert 466 may be removed with the mold 464, or may be removed separately, leaving a conduit hole 432 through the encapsulation material 418. The conduit hole 432 extends to the integrated circuit 402.

Figure 4D:
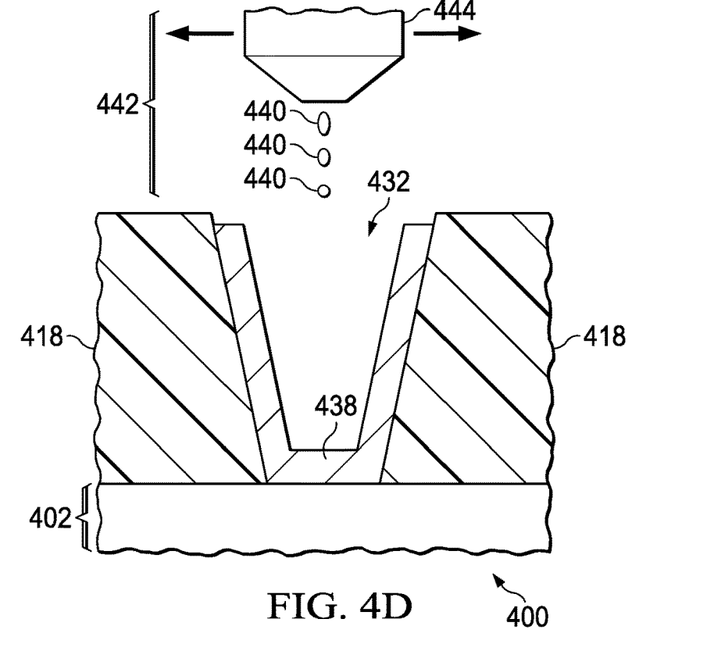

Referring to FIG. 4D, a nanoparticle ink film 438 is formed by dispensing a nanoparticle ink 440 by an additive process 442 into the conduit hole 432. The additive process 442 may use a discrete droplet dispensing apparatus 444, as indicated in FIG. 4D, such as an ink jet apparatus. Other manifestations of the additive process 442, such as a continuous extrusion process, a direct laser transfer process, an electrostatic deposition process, or an electrochemical deposition process, are within the scope of the instant example. The nanoparticle ink film 438 is disposed on a bottom and on sidewalls of the conduit hole 432 as depicted in FIG. 4D, contacting the integrated circuit 402. The nanoparticle ink 440 includes the nanoparticles and a carrier fluid. The nanoparticle ink 440 may be, for example, an ink, a slurry, or a sol gel. The nanoparticles include metals appropriate for subsequent catalysis of graphitic material, for example the metals described in reference to FIG. 2B. There may be inorganic functional molecules on surfaces of the nanoparticles. The nanoparticle ink 440 is dispensed into the conduit hole 432, and is not dispensed over the encapsulation material 418 adjacent to the conduit hole 432.

Figure 4E:
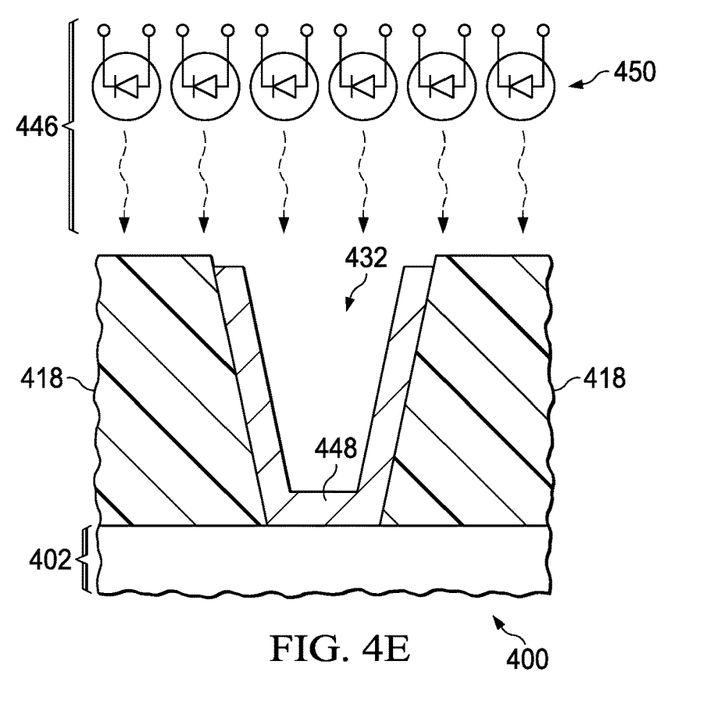

Referring to FIG. 4E, the nanoparticle ink film 438 of FIG. 4D is heated by a bake process 446 to remove at least a portion of a volatile material from the nanoparticle ink film 438 to form a nanoparticle film 448 which includes primarily nanoparticles. The bake process 446 may be a radiant heat process using, for example infrared light emitting diodes (IR LEDs) 450, as indicated schematically in FIG. 4E. Using IR LEDs 450 in a scanned system may enable applying the radiant heat to substantially heat only the nanoparticle ink film 438 while not applying the radiant heat to areas of the encapsulation material 418 outside of the conduit hole 432, advantageously reducing risk of thermal damage to the encapsulation material 418. Alternatively, the bake process 446 may use another radiant heat source such as an incandescent lamp, or may be an oven process.

Figure 4F:
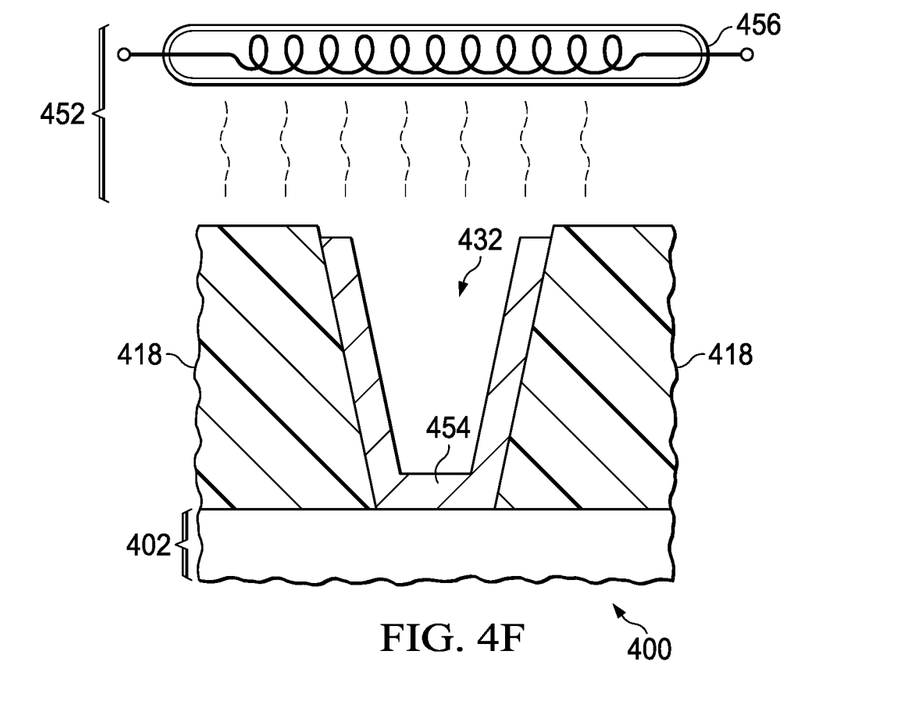

Referring to FIG. 4F, the nanoparticle film 448 of FIG. 4E is heated by a cohesion inducing process 452 so that adjacent nanoparticles cohere to each other, to form a cohered nanoparticle film 454 in the conduit hole 432. The nanoparticles may be selected to enable cohesion at a temperature compatible with the encapsulation material 418. Cohesion may occur by a process that includes a physical mechanism and/or a chemical mechanism. The cohesion inducing process 452 may include a spike heating process, which provides radiant energy from an incandescent source 456 as depicted in FIG. 4F. Alternatively, the nanoparticle film 448 may be heated by a scanned laser heating process or a flash heating process.

Figure 4G:
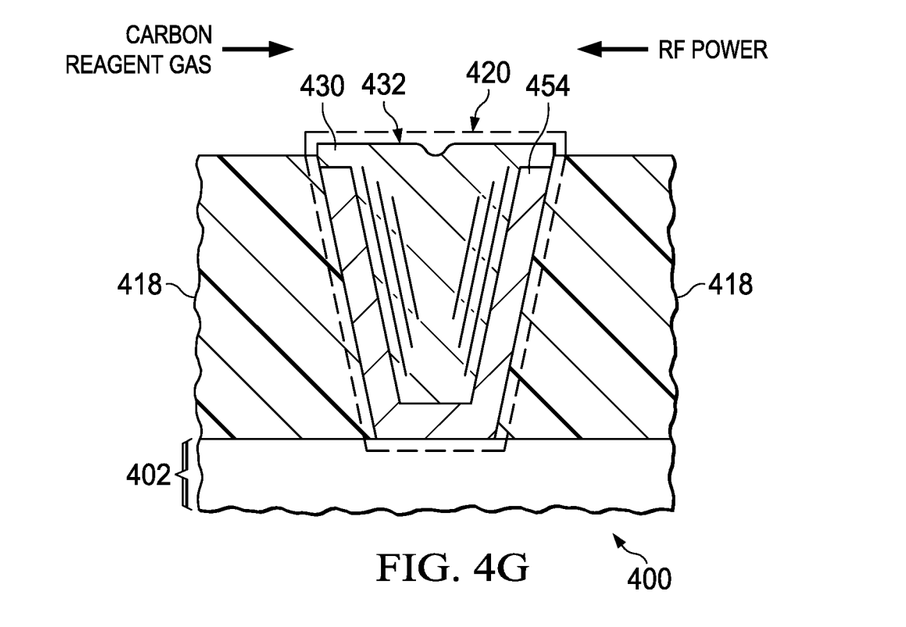

Referring to FIG. 4G, a graphitic material 430 is selectively formed in the conduit hole 432 on the cohered nanoparticle film 454 by a graphitic material plasma enhanced chemical vapor deposition (PECVD) process. In the graphitic material PECVD process, the packaged electronic device 400 is heated, for example to a temperature of 200° C. to 400° C. A carbon-containing reagent gas, denoted in FIG. 4G as "CARBON REAGENT GAS" is flowed over the encapsulation material 418. The carbon-containing reagent gas may include, for example, methane, straight chain alkanes such as ethane, propane and/or butane, alcohols such as ethanol, and/or cyclic hydrocarbons such as cyclobutane or benzene. Additional gases, such as hydrogen, argon and/or oxygen, may be flowed over the integrated circuit 400. Radio frequency (RF) power, denoted in FIG. 4G as "RF POWER" is applied to the carbon-containing reagent gas to generate carbon radicals above the packaged electronic device 400. The metal in the cohered nanoparticle film 454 catalyzes the carbon radicals to react to form a first layer of the graphitic material 430 selectively on the cohered nanoparticle film 454. Subsequent layers of the graphitic material 430 are formed selectively on the previously formed layers of graphitic material 430, so that the graphitic material 430 is formed in the conduit hole 432, and graphitic material is not formed elsewhere on the encapsulation material 418. The graphitic material 430 is electrically conductive. A combination of the cohered nanoparticle film 454 and the graphitic material 430 provide the thermal conduit 420.

Figure 5:
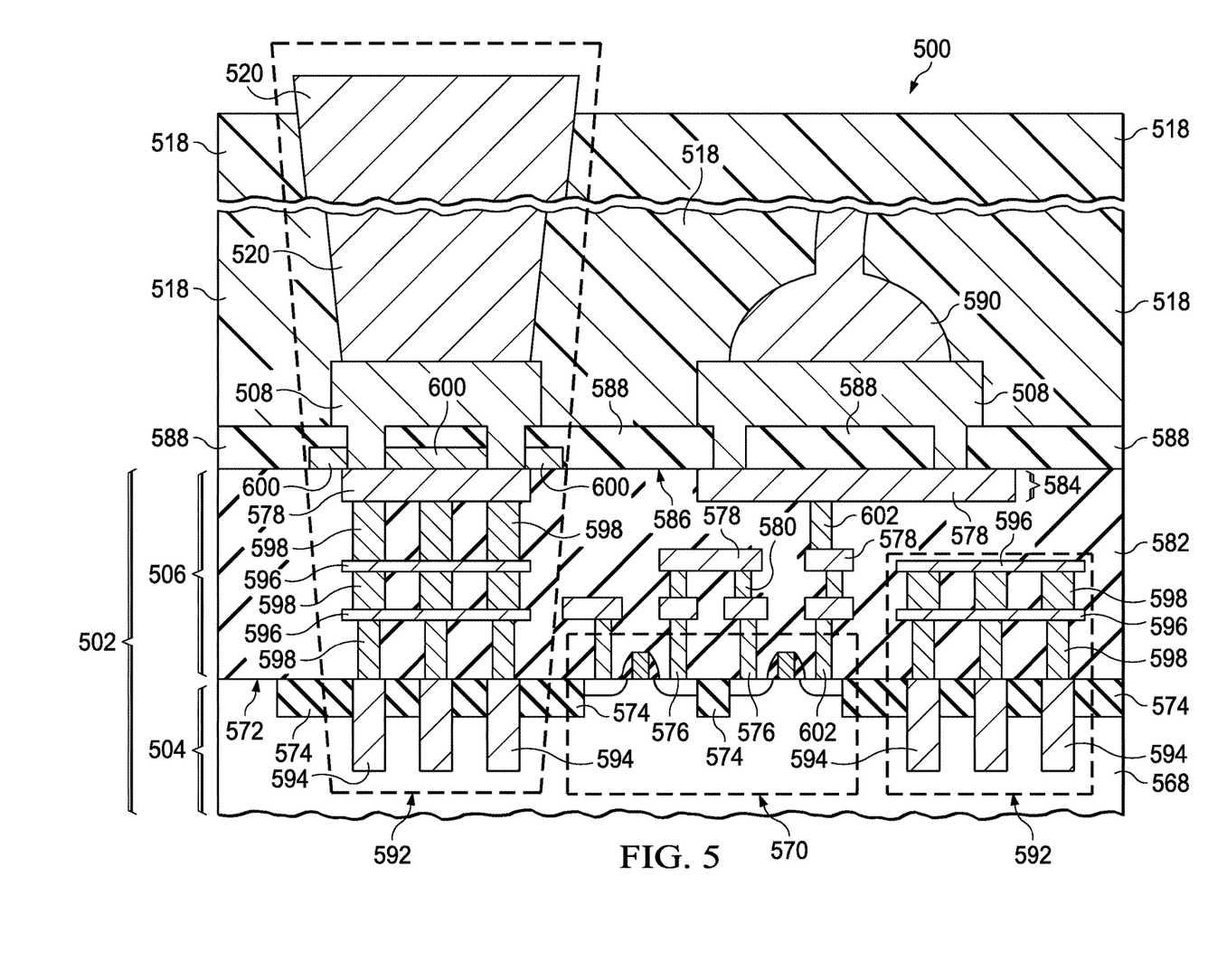
FIG. 5 is a cross section of an example packaged electronic device which includes a combined thermal routing structure according to an embodiment of the invention.

FIG. 5 is a cross section of an example packaged electronic device which includes a combined thermal routing structure according to an embodiment of the invention. The packaged electronic device 500 includes an integrated circuit 502, which includes a substrate 504 comprising a semiconductor material 568. The integrated circuit 502 further includes an interconnect region 506 disposed above the substrate 504. Active components 570 are disposed in the substrate 504 and the interconnect region 506, at a boundary 572 between the substrate 504 and the interconnect region 506. The active components 570 may be, for example, MOS transistors, bipolar junction transistors, JFETs, and/or SCRs. The active components 570 may be laterally separated by field oxide 574 at the boundary 572 between the substrate 504 and the interconnect region 506.

The interconnect region 506 may include contacts 576, interconnects 578 and vias 580 disposed in a dielectric layer stack 582. Some of the interconnects 578 are disposed in a top interconnect level 584 which is located at a top surface 586 of the interconnect region 506. The top surface 586 of the interconnect region 506 is located at a surface of the interconnect region 506 opposite from the boundary 572 between the substrate 504 and the interconnect region 506. Bond pad structures 508 may be disposed over the top surface 586, and are electrically coupled to the interconnects 578 in the top interconnect level 584. A protective overcoat 588 is disposed over the top surface 586 of the interconnect region 506. In the instant example, the integrated circuit 502 may be assembled using wire bonds 590 on some of the bond pad structures 508. The integrated circuit 502 is packaged by encapsulation in an encapsulation material 518 which contacts the integrated circuit 502.

The packaged electronic device 500 of the instant example includes the combined thermal routing structure 592, which extends from inside the substrate 504 through the interconnect region 506, and through the organic polymer encapsulation material 518. The combined thermal routing structure 592 may conduct heat generated by the components 570 to a heat removal apparatus, such as a heat sink, not shown in FIG. 5, located outside of the packaged electronic device 500, which may advantageously reduce an operating temperature of the components 570. The combined thermal routing structure 592 includes a thermal conduit 520 disposed through the encapsulation material 518 to the integrated circuit 502 according to any of the examples disclosed herein.

The combined thermal routing structure 592 may include a thermal routing trench 594 disposed in the substrate 504. The thermal routing trench 594 may surround a portion of the components 570 and may be connected to each other at locations out of the plane of FIG. 5. The thermal routing trench 594 may have a structure and may be formed, for example, as described in the commonly assigned patent application having patent application Ser. No. 15/361,399, which is incorporated herein by reference.

The combined thermal routing structure 592 may include an interconnect region thermal routing structure 596 disposed in the interconnect region 506. The interconnect region thermal routing structure 596 may surround a portion of the components 570 and may be connected to each other at locations out of the plane of FIG. 5. The interconnect region thermal routing structure 596 may have a structure and may be formed, for example, as described in the commonly assigned patent application having patent application Ser. No. 15/361,394, which is incorporated herein by reference.

The combined thermal routing structure 592 may include high thermal conductivity vias 598 disposed in the interconnect region 506. The high thermal conductivity vias 598 may have structures and may be formed, for example, as described in the commonly assigned patent application having patent application Ser. No. 15/361,399, which is incorporated herein by reference.

The combined thermal routing structure 592 may include a top level thermal conductivity structure 600 disposed above the top interconnect level 584. The top level thermal conductivity structure 600 may have a structure and may be formed, for example, as described in the commonly assigned patent application having patent application Ser. No. 15/361,390, which is incorporated herein by reference.

The integrated circuit 502 may further include graphitic vias 602 which are electrically coupled to the components 570. The graphitic vias 602 may conduct heat generated by the components 570 away from the substrate 504, possibly to the combined thermal routing structure 592, which may advantageously reduce an operating temperature of the components 570. The graphitic vias 602 may have structures and may be formed, for example, as described in the commonly assigned patent application having patent application Ser. No. 15/361,401, which is incorporated herein by reference.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A device comprising:
   an integrated circuit;
   a material covering at least part of the integrated circuit, the material including an opening that penetrates through the material; and
   a layer of nanoparticles on at least part of an internal wall of the opening and over at least part of the integrated circuit.

2. The device of claim 1, wherein the material includes opposite surfaces, and the layer of nanoparticles reaches the opposite surfaces of the material.

3. The device of claim 2, wherein the layer of nanoparticles is on one of the opposite surfaces of the material and extends into the opening.

4. The device of claim 1, further comprising a temperature measurement structure coupled to the layer of nanoparticles.

5. The device of claim 1, further comprising a heat sink coupled to the layer of nanoparticles.

6. The device of claim 1, wherein the layer of nanoparticles includes at least one of: aluminum oxide, diamond, hexagonal boron nitride, cubic boron nitride, or aluminum nitride.

7. The device of claim 1, wherein the layer of nanoparticles includes at least one of: metal, graphene, graphene embedded in metal, graphite, graphitic carbon, or carbon nanotubes.

8. The device of claim 1, wherein the layer of nanoparticles includes at least one of: copper, nickel, palladium, platinum, iridium, rhodium, cerium, osmium, molybdenum, or gold.

9. The device of claim 1, further comprising graphite on the layer of nanoparticles and in the opening.

10. The device of claim 1, wherein the layer of nanoparticles is substantially free of any organic binder material.

11. The device of claim 1, wherein the layer of nanoparticles includes primarily nanoparticles.

12. The device of claim 11, wherein the layer of nanoparticles is a first layer of nanoparticles, and the device further comprises a second layer of nanoparticles on the first layer of nanoparticles.

13. The device of claim 1, wherein the layer of nanoparticles is configurable to be a thermal conduit.

14. The device of claim 1, wherein the integrated circuit includes a layer of interconnects on a substrate, and the layer of nanoparticles is on the layer of interconnects.

15. The device of claim 14, further comprising a metal pad coupled between the layer of nanoparticles and the layer of interconnects.

16. The device of claim 14, wherein a side of the integrated circuit is a side of the substrate opposite from the interconnects.

17. The device of claim 1, further comprising a chip carrier on which the integrated circuit is mounted, and the side faces away from the chip carrier.

18. The device of claim 1, wherein the material is an encapsulation material.

19. A device comprising:
   an integrated circuit including:
      a substrate that includes a first surface and a second surface opposite the first surface; and
      an interconnect structure on the first surface of the substrate;
   a layer of nanoparticles on the integrated circuit, the layer of nanoparticles including a bottom portion and two protruding top portions on two sides of the bottom portion, in which the bottom portion is conformal to and in direct contact with the interconnect structure or the second surface and is between the integrated circuit and the two protruding top portions.

20. The device of claim 19, further comprising a material covering at least part of the integrated circuit, wherein the material includes an opening that penetrates through the material, and the bottom portion and the two protruding portions are in the opening.

21. The device of claim 20, wherein the layer of nanoparticles extends from inside the opening and above the material.

22. The device of claim 19, wherein the layer is a first layer, and the device further comprises a second layer of material on the first layer of nanoparticles, and wherein the second layer of material includes nanoparticles of a second material, the second material including at least one of: aluminum oxide, diamond, hexagonal boron nitride, cubic boron nitride, or aluminum nitride.

23. The device of claim 19, wherein the layer is a first layer, and the device further comprises a second layer of material on the first layer of nanoparticles, and wherein the second layer of material includes nanoparticles of a second material, the second material including at least one of: metal, graphene, graphene embedded in metal, graphite, graphitic carbon, or carbon nanotubes.

24. The device of claim 19, wherein the layer is a first layer, and the device further comprises a second layer of material on the first layer of nanoparticles, and wherein the second layer of material includes nanoparticles of a second material, the second material including at least one of: copper, nickel, palladium, platinum, iridium, rhodium, cerium, osmium, molybdenum, or gold.

25. The device of claim 19, wherein the layer of nanoparticles includes graphite.

* * * * *